United States Patent
Toh et al.

(10) Patent No.: US 9,673,388 B2
(45) Date of Patent: Jun. 6, 2017

(54) INTEGRATED CIRCUIT STRUCTURES WITH SPIN TORQUE TRANSFER MAGNETIC RANDOM ACCESS MEMORY AND METHODS FOR FABRICATING THE SAME

(71) Applicant: GLOBALFOUNDRIES Singapore Pte. Ltd., Singapore (SG)

(72) Inventors: Eng Huat Toh, Singapore (SG); Xuan Anh Tran, Singapore (SG); Elgin Kiok Boone Quek, Singapore (SG)

(73) Assignee: GLOBALFOUNDRIES SINGAPORE PTE. LTD., Singapore (SG)

( * ) Notice: Subject to any disclaimer, the term of this patent is extended or adjusted under 35 U.S.C. 154(b) by 41 days.

(21) Appl. No.: 14/518,696

(22) Filed: Oct. 20, 2014

(65) Prior Publication Data
US 2016/0111629 A1    Apr. 21, 2016

(51) Int. Cl.
*H01L 21/00* (2006.01)
*H01L 43/12* (2006.01)
*H01L 43/08* (2006.01)

(52) U.S. Cl.
CPC ............ *H01L 43/12* (2013.01); *H01L 43/08* (2013.01)

(58) Field of Classification Search
CPC ................................. H01L 43/12; H01L 43/08
See application file for complete search history.

(56) References Cited

U.S. PATENT DOCUMENTS

| 8,416,600 | B2 | 4/2013 | Lin et al. | |
|---|---|---|---|---|
| 8,482,966 | B2* | 7/2013 | Kang | G01R 33/098 257/421 |
| 9,082,956 | B2* | 7/2015 | Liu | H01L 43/08 |
| 2002/0186583 | A1* | 12/2002 | Tuttle | G11C 11/16 365/171 |
| 2006/0284242 | A1* | 12/2006 | Jo | H01L 21/28273 257/316 |
| 2011/0090732 | A1* | 4/2011 | Li | G11C 11/16 365/158 |
| 2012/0248557 | A1* | 10/2012 | Liu | H01L 43/08 257/421 |
| 2013/0075840 | A1* | 3/2013 | Satoh | H01L 43/12 257/421 |
| 2015/0325622 | A1* | 11/2015 | Zhang | H01L 27/222 257/421 |

(Continued)

*Primary Examiner* — Laura Menz
(74) *Attorney, Agent, or Firm* — Lorenz & Kopf, LLP

(57) ABSTRACT

A method for fabricating an STT-MRAM integrated circuit includes forming a fixed layer over a bottom electrode layer, forming a silicon oxide layer a hardmask layer over the fixed, and forming a trench within the silicon oxide and hardmask layers, thereby exposing an upper surface of the fixed layer and sidewalls of the silicon oxide and hardmask layer. The method further includes forming a conformal barrier layer along the sidewalls of the silicon oxide and hardmask layers and over the upper surface of the fixed layer, such that the conformal barrier layer comprises sidewall portions adjacent the sidewalls of the silicon oxide and hardmask layers and a central portion in between the sidewall portions and adjacent the upper surface of the fixed layer. The method further includes forming a free layer between the sidewall portions of the barrier layer and over the central portion of the barrier layer.

20 Claims, 2 Drawing Sheets

(56) References Cited

U.S. PATENT DOCUMENTS

| | | | |
|---|---|---|---|
| 2016/0111629 A1* | 4/2016 | Toh | H01L 43/12 257/421 |
| 2016/0133669 A1* | 5/2016 | Toh | H01L 43/02 257/421 |
| 2016/0254440 A1* | 9/2016 | Wang | H01L 43/08 257/421 |

* cited by examiner

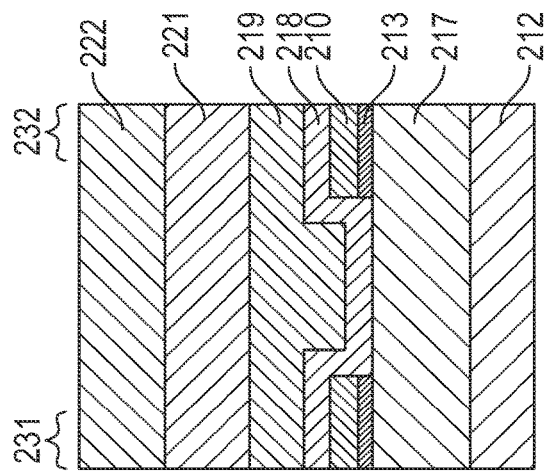
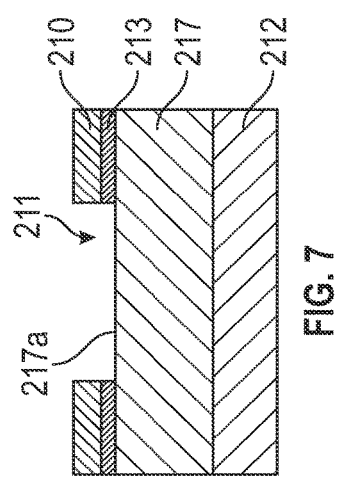
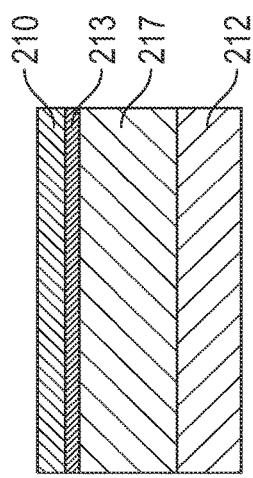
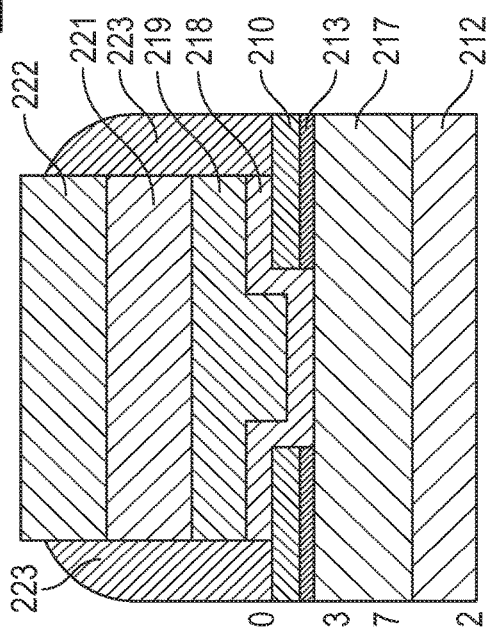

INTEGRATED CIRCUIT STRUCTURES WITH SPIN TORQUE TRANSFER MAGNETIC RANDOM ACCESS MEMORY AND METHODS FOR FABRICATING THE SAME

TECHNICAL FIELD

The present disclosure generally relates to integrated circuits and methods for fabricating integrated circuits. More particularly, the present disclosure relates to spin torque transfer magnetic random access memory (STT-MRAM) structures in integrated circuits and methods for fabricating the same.

BACKGROUND

Magnetic Random Access Memory (MRAM) is a non-volatile computer memory technology based on magnetoresistance. MRAM differs from volatile Random Access Memory (RAM) in several respects. Because MRAM is non-volatile, MRAM can maintain memory content when the memory device is not powered. Though non-volatile RAM is typically slower than volatile RAM, MRAM has read and write response times that are comparable to that of volatile RAM. Unlike typical RAM technologies that store data as electric charges, MRAM data is stored by magnetoresistive elements. Generally, the magnetoresistive elements are made from two magnetic layers, each of which holds a magnetization. The magnetization of one layer (the "pinned layer") is fixed in its magnetic orientation, and the magnetization of the other layer (the "free layer") can be changed by an external magnetic field generated by a programming current. Thus, the magnetic field of the programming current can cause the magnetic orientations of the two magnetic layers to be either parallel, giving a lower electrical resistance across the layers ("0" state), or antiparallel, giving a higher electrical resistance across the layers ("1" state). The switching of the magnetic orientation of the free layer and the resulting high or low resistance states across the magnetic layers provide for the write and read operations of the typical MRAM cell.

Though MRAM technology offers non-volatility and faster response times, the MRAM cell is limited in scalability and susceptible to write disturbances. The programming current employed to switch between higher and lower electrical resistance states across the MRAM magnetic layers is typically high. Thus, when multiple cells are arranged in an MRAM array, the programming current directed to one memory cell may induce a field change in the free layer of an adjacent cell. This potential for write disturbances, also known as the "half-select problem," can be addressed using a spin torque transfer technique.

A conventional spin torque transfer MRAM (STT-MRAM) cell may include a magnetic cell stack, which may be a magnetic tunnel junction (MTJ) or a spin valve structure. An MTJ is a magnetoresistive data storing element including two magnetic layers (one pinned and one free) and an insulating layer in between the two magnetic layers; a bit line, a word line; a source line; and an access transistor. A spin valve structure has a structure similar to the MTJ, except a spin valve structure has a conductive layer in between the two magnetic layers. A programming current typically flows through the access transistor and the magnetic cell stack. The pinned layer polarizes the electron spin of the programming current, and torque is created as the spin-polarized current passes through the stack. The spin-polarized electron current interacts with the free layer by exerting a torque on the free layer. When the torque of the spin-polarized electron current passing through the stack is greater than the critical switching current density ($J_C$), the torque exerted by the spin-polarized electron current is sufficient to switch the magnetization of the free layer. Thus, the magnetization of the free layer can be aligned to be either parallel or antiparallel to the pinned layer, and the resistance state across the stack is changed.

The STT-MRAM has advantageous characteristics over the MRAM, because the spin-polarized electron current eliminates the need for an external magnetic field to switch the free layer in the magnetoresistive elements. Further, scalability is improved as the programming current decreases with decreasing cell sizes, and the writing disturbance and half-select problem is addressed. Additionally, STT-MRAM technology allows for a higher tunnel magnetic resistance ratio, meaning there is a larger ratio between higher and lower electrical resistance states, thereby improving read operations in the magnetic domain.

Presently-known STT-MRAM structures and methods for fabricating such structures all suffer from several drawbacks. For example, during the patterning of the free layer, it is desirable to use the underlying insulating or barrier layer as an etch stop layer. However, given that the insulating or barrier layer is typically thin, for example on the order of about 1 to about 3 nm in thickness, the insulating or barrier layer does not serve as a very effective etch stop layer. In many instances, over-etching has been observed, wherein the etch of the free layer passes through the insulating or barrier layer and into the fixed or pinned layer formed there-below. This inadvertent etching of the fixed or pinned layer causes several undesirable defects, including what is known in the art as a "magnetic dead layer" (i.e., a portion of the fixed layer having no magnetic properties), which can result in a non-functioning device. Additionally, inadvertent etching through the insulating or barrier layer can cause non-volatile by-products of the fabrication process (such as the magnetic material of the fixed layer) to form on sides of the insulating or barrier layer, which also can result in a non-functioning device by shorting the fixed and free layers.

Accordingly, with the increasing use of STT-MRAM in stand-alone memory application, it is desirable to provide robust and reliable STT-MRAM structures. Additionally, it is desirable to provide methods for the fabrication of such structures that are easily integrated into existing process flow schemes used in semiconductor fabrication facilities. Still further, it is desirable to provide such structures and methods that prevent etching through the insulating or barrier layer while patterning the free layer. Furthermore, other desirable features and characteristics of the present disclosure will become apparent from the subsequent detailed description and the appended claims, taken in conjunction with the accompanying drawings and the foregoing technical field and background.

BRIEF SUMMARY

Spin torque transfer magnetic random access memory in integrated circuits and methods for fabricating the same are disclosed. In one exemplary embodiment, a method of fabricating a spin torque transfer magnetic random access memory integrated circuit includes forming a bottom electrode layer, forming a fixed layer over the bottom electrode layer, forming a silicon oxide layer over the fixed layer, and forming a hardmask layer over the silicon oxide layer. The method further includes forming a trench within the silicon oxide and hardmask layers, thereby exposing an upper surface of the fixed layer and sidewalls of the silicon oxide and hardmask layers, and forming a conformal barrier layer along the sidewalls of the silicon oxide and hardmask layers and over the upper surface of the fixed layer, such that the conformal barrier layer comprises sidewall portions adjacent the sidewalls of the silicon oxide and hardmask layers and a central portion in between the sidewall portions and adjacent the upper surface of the fixed layer. The method further includes forming a free layer between the sidewall portions of the barrier layer and over the central portion of the barrier layer and forming a top electrode layer over and adjacent the free layer.

In another exemplary embodiment, a spin torque transfer magnetic random access memory integrated circuit structure includes a bottom electrode layer, a fixed layer over the bottom electrode layer, a silicon oxide layer over the fixed layer, a hardmask layer over the silicon oxide layer, and a conformal barrier layer within the silicon oxide and hardmask layers. The conformal barrier layer is disposed along sidewalls of the silicon oxide and hardmask layers and over an upper surface of the fixed layer such that the conformal barrier layer comprises sidewall portions adjacent the sidewalls of the silicon oxide and hardmask layers and a central portion in between the sidewall portions and adjacent the upper surface of the fixed layer. The structure further includes a free layer between the sidewall portions of the barrier layer and over the central portion of the barrier layer and a top electrode layer over and adjacent the free layer.

BRIEF DESCRIPTION OF THE DRAWINGS

The present disclosure will hereinafter be described in conjunction with the following drawing figures, wherein like numerals denote like elements, and wherein:

FIGS. 6-10 illustrate, in cross section, STT-MRAM structures and methods for fabricating STT-MRAM integrated circuits in accordance with another embodiment of the present disclosure.

DETAILED DESCRIPTION

Figure 1:
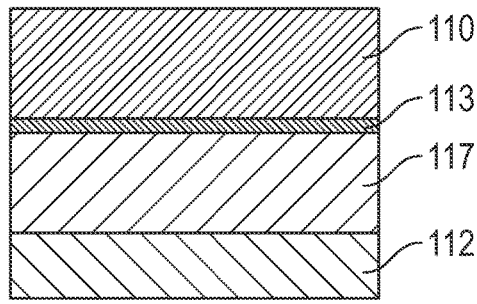
FIGS. 1-5 illustrate, in cross section, STT-MRAM structures and methods for fabricating STT-MRAM integrated circuits in accordance with one embodiment of the present disclosure.

The following detailed description is merely illustrative in nature and is not intended to limit the embodiments of the subject matter or the application and uses of such embodiments. Furthermore, there is no intention to be bound by any expressed or implied theory presented in the preceding technical field, background, brief summary or the following detailed description.

Embodiments of the present disclosure are generally directed to spin torque transfer magnetic random access memory (STT-MRAM) integrated circuit structures and methods for fabricating the same. For the sake of brevity, conventional techniques related to integrated circuit device fabrication may not be described in detail herein. Moreover, the various tasks and process steps described herein may be incorporated into a more comprehensive procedure or process having additional steps or functionality not described in detail herein. In particular, various steps in the manufacture of semiconductor-based transistors are well-known and so, in the interest of brevity, many conventional steps will only be mentioned briefly herein or will be omitted entirely without providing the well-known process details.

FIGS. 1-5 illustrate, in cross section, STT-MRAM integrated circuit structures and methods for fabricating STT-MRAM integrated circuit structures in accordance with one embodiment of the present disclosure. The partially-formed integrated circuit structure illustrated in FIG. 1 includes a metal layer 112. The metal layer 112 functions as a bottom electrode of the STT-MRAM structure to be formed. Although not illustrated, the metal layer 112 may be provided within and/or above an inter-layer dielectric (ILD) layer, separating the metal layer 112 from other metal layers of the integrated circuit structure. By the term "within," it is meant that the metal layer 112 is embedded in the ILD layer, wherein, optionally, a top surface of the bottom electrode 112 is substantially coplanar with a top surface of the ILD layer, and the bottom electrode 112 extends downward into the ILD layer. The ILD layer may be formed of one or more low-k dielectric materials, un-doped silicate glass (USG), silicon nitride, silicon oxynitride, or other commonly used materials. The dielectric constants (k value) of the low-k dielectric materials may be less than about 3.9, for example, less than about 2.8. The bottom electrode 112 may be formed of a conductive material, such as a metal or a metal alloy. In an embodiment, bottom electrode 112 is formed of tantalum, tantalum nitride, titanium, and/or other commonly used conductive metals. In one embodiment, the bottom electrode 112 is in physical and electrical connection with other metallization layers of the integrated circuit structure (not shown). The ILD layer and the bottom electrode 112 may be formed through conventional techniques.

Though not illustrated for simplicity in FIGS. 1-5, the bottom electrode 112 may be formed over other ILD and/or metallization layers, and also over an active region of a semiconductor substrate forming part of the integrated circuit structure. The bottom electrode 112 may be formed during back-end-of-line processes (BEOL). For example, in one embodiment, the STT-MRAM feature according to the present disclosure may be formed during BEOL processes, for example between the $3^{rd}$ and $4^{th}$ metallization layers (M3/M4) of the device, although the embodiments are not to be understood as limited to such. The substrate may include a plurality of isolation features (not shown), such as shallow trench isolation (STI) features or local oxidation of silicon (LOCOS) features. The isolation features may define and isolate the various microelectronic elements (not shown), also referred to herein as the aforesaid active regions. Examples of the various microelectronic elements that may be formed in the substrate include transistors (e.g., metal oxide semiconductor field effect transistors (MOSFET) and bipolar junction transistors (BJT)), and/or other suitable elements. This microelectronic element is used as a selector device for an exemplary STT-MRAM cell.

As further illustrated in FIG. 1, three additional layers are deposited and patterned over the bottom electrode 112, including a pinned or fixed layer 117, a thin (i.e., about 1 to about 2 nm in thickness) silicon oxide layer 113, and a hardmask layer 110. The fixed layer 117 of the STT-MRAM structure is formed (deposited) over an upper surface of the bottom electrode 112. In an exemplary embodiment, the fixed layer 117 is formed of a cobalt iron boron (CoFeB), platinum manganese (PtMn), iridium manganese (IrMn), nickel manganese (NiMn), or iron manganese (FeMn) material. The general term "fixed layer" is used in the present disclosure. It will be appreciated that the fixed layer could include multiple layers such as a synthetic anti-ferromagnetic (SAF) layer to ensure that the fixed layer magnetism is fixed. Other fine-tuning layer(s) to improve coupling could also be added, in an embodiment. The thickness of layer 117 may be substantially similar along its entire length. The hardmask layer 110 may be formed of a silicon nitride material, for example. For example, in a particular embodiment, the "stack" of material layers may be as follows, from the bottom electrode 112 through a top electrode (described in greater detail with regard to FIG. 4): a TaN bottom electrode layer, a Ta seed layer overlying the TaN bottom electrode layer, a PtMn antiferromagnetic layer over the Ta seed layer, a CoFe pinned layer overlying the PtMn antiferromagnetic layer, an Ru coupling layer overlying the CoFe pinned layer, a CoFeB reference layer overlying the Ru coupling layer, a MgO barrier layer overlying the CoFeB reference layer, a CoFeB free layer overlying the MgO barrier layer, a Ta capping layer overlying the CoFeB free layer, and a TaN top electrode overlying the Ta capping layer.

Figure 2:
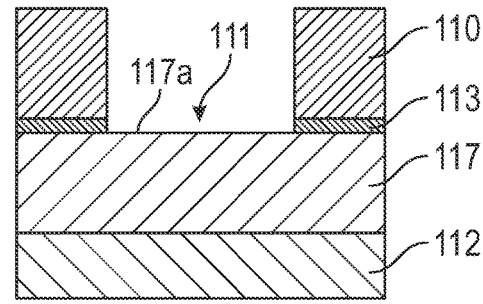

Subsequent to deposition of the respective materials of layers 117, 113, and 110 as shown in FIG. 1, and with reference now to FIG. 2, both the oxide layer 113 and the hardmask layer 110 are patterned and etched by a suitable patterning and etching process, such as photolithographic patterning and etching. For example, a photoresist material layer (not separately illustrated) is deposited over the oxide and hardmask material layer 110. The photoresist material layer is then patterned by exposure to a light source using conventional photolithographic processes. The patterning is performed so as to remove the photoresist material layer such that the only remaining photoresist material is disposed on an area that is centered over the bottom electrode 112, but has a width that is less than that of the bottom electrode. One or more etching steps are then performed to transfer the pattern to the silicon oxide material and the hardmask material, resulting in an oxide layer 113 and hardmask layer 110, which include a trench 111 that is formed within such layers and centered over, but narrower than, the bottom electrode 112. In this manner, a portion 117*a* of the upper surface of the fixed layer 117 is exposed at the bottom of trench 111. The remaining portions of the patterned photoresist layer are then removed (for example by a photoresist strip), resulting substantially in the structure illustrated in FIG. 2. In another embodiment, the photoresist is used to etch the hardmask by dry reactive ion etching (RIE) and then removed by a photoresist strip. After which, wet clean or pre-sputtering before depositing the barrier layer is used to remove the oxide layer.

Figure 3:
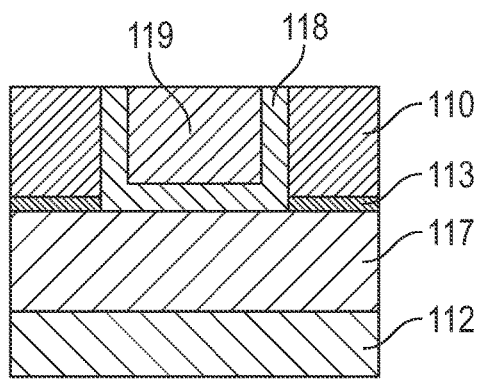

FIG. 3 illustrates the formation of additional material layers over and within the above-described structure shown in FIG. 2, namely over the portion 117*a* of the upper surface of the fixed layer 117 and within the trench 111. With reference to FIG. 3, these additional material layers include an insulating or barrier layer 118 and a free layer 119. An exemplary barrier layer 118 is formed by conformal deposition within the trench 111, including along sidewalls of the trench and over the portion 117*a* in a conformal manner, and also on top of the hardmask. The exemplary free layer 119 is then deposited over the conformal layer so as to fill remaining portions of the trench 111 (for example using known blanket deposition techniques). In an exemplary embodiment, a suitable planarization or etching process is then performed, using the hardmask layer 110 as an etch stop, such that the barrier layer (i.e., those portions along the sidewalls of the trench 111) and the free layer 119 have upper surfaces that are substantially co-planar with the upper surface of the hardmask layer 110, as shown in FIG. 3. In an exemplary embodiment, the barrier layer 118 is formed of MgO, and the free layer 119 is formed of CoFeB. As used herein, the term "formed of" means that the recited material is at least 50% of the formed layer. Other suitable materials for these well-understood layers are known to those having ordinary skill in the art.

Figure 4:
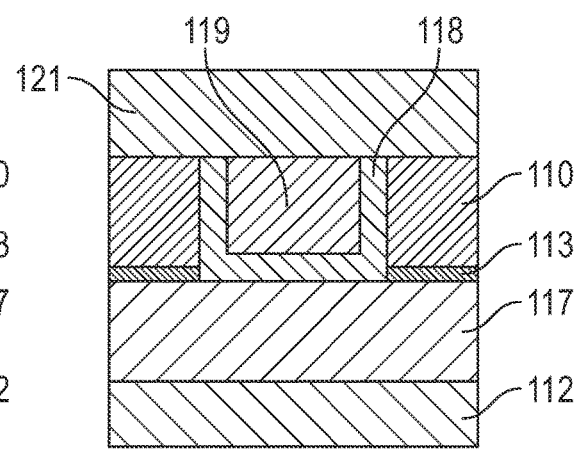

With reference now to FIG. 4, top electrode 121 is formed of a conductive material, such as a metal or a metal alloy. In an embodiment, top electrode 121 is formed of tantalum, tantalum nitride, titanium, and/or other commonly used conductive metals. The formation of layer 121 may be performed using appropriate CVD techniques. The top electrode 121 is formed over the aforementioned substantially co-planar surface of layers 110, 118, and 119. Thereafter, a further ILD layer (not illustrated) is optionally formed over top electrode 121. This ILD layer may also be formed of one or more low-k dielectric materials, un-doped silicate glass (USG), silicon nitride, silicon oxynitride, or other commonly used materials.

Accordingly, the structure illustrated in FIG. 4 includes a bottom electrode 112, a fixed layer 117 formed over the bottom electrode, and a silicon oxide layer 113 and a hardmask layer 110 formed over the fixed layer 117. Formed within the silicon oxide layer 113 and the hardmask layer 110 is a barrier layer 118 that is formed conformally along sidewalls of the silicon oxide layer 113 and the hardmask layer 110 and over a portion 117*a* of the upper surface of the fixed layer 117. Formed over the barrier layer 118 is a free layer 119. The hardmask layer 110, the sidewall-deposited portions of the barrier layer 118, and the free layer 119 all have upper surfaces that are substantially coplanar with one another. Formed over the coplanar upper surfaces is a top electrode layer 121. In an alternative embodiment, the fixed layer and bottom electrode could be etched after the process shown in FIG. 4, if it is not defined initially as in FIG. 1.

Figure 5:
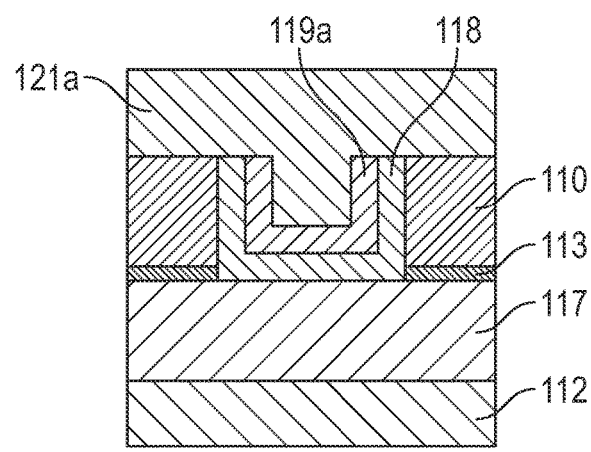

FIG. 5 illustrates a variation of the embodiment illustrated in connection with FIGS. 1-4. The variation shown in FIG. 5 includes a free layer 119*a* that is formed conformally over the conformally-formed barrier layer 118, such that the conformal free layer 119*a* does not fill an entirety of the trench 111. Accordingly, when the top electrode material is subsequently deposited, the top electrode material fills the remaining portions of the trench 111, resulting in a top electrode 121*a* that extends into the trench 111 and between sidewall portions of the conformal barrier layer 118 and the conformal free layer 119*a*.

Accordingly, the structure illustrated in FIG. 5 includes a bottom electrode 112, a fixed layer 117 formed over the bottom electrode, and a silicon oxide layer 113 and a hardmask layer 110 formed over the fixed layer 117. Formed within the silicon oxide layer 113 and the hardmask layer 110 are a barrier layer 118 and a free layer 119*a* that are both formed conformally along sidewalls of the silicon oxide layer 113 and the hardmask layer 110 and over a portion 117*a* of the upper surface of the fixed layer 117, the free layer 119a being formed over the barrier layer 118. The hardmask layer 110, the sidewall-deposited portions of the barrier layer 118, and the free layer 119*a* all have upper surfaces that are substantially coplanar with one another. Formed over the coplanar upper surfaces and between the sidewall portions of the free layer 119*a* is a top electrode layer 121*a*.

Beneficially, the above-described methods do not require the use of the barrier layer 118 as an etch-stop layer while etching the free layer 119. Rather, during the etching/planarization of the free layer, the hardmask serves as an appropriate etch stop. Further, with the silicon oxide layer 113 and the hardmask layer 110 being disposed along sidewalls of the barrier layer 118, there is no possibility for unwanted by-products to be formed thereon.

FIGS. 6-10 illustrate, in cross section, STT-MRAM integrated circuit structures and methods for fabricating STT-MRAM integrated circuit structures in accordance with another embodiment of the present disclosure. The partially-formed integrated circuit structure illustrated in FIGS. 6 and 7, including bottom electrode 212, fixed layer 217, silicon oxide layer 213, hardmask layer 210, and trench 211 is formed substantially as described above with regard to FIGS. 1 and 2, above. Accordingly, for brevity, the process steps and materials used in the fabrication of the partially-formed IC structures in FIGS. 6 and 7 is not repeated here.

Continuing with FIG. 8, the barrier layer 218 is formed by conformal deposition within the trench 111, including along sidewalls of the trench and over the portion 117a in a conformal manner. As before, the barrier layer 218 is also necessarily formed over the upper surface of the hardmask layer 210, but as shown in FIG. 8, the barrier layer 218 is not etched/planarized from the upper surface of the hardmask layer 210. Additionally, the free layer 219 is deposited using blanket deposition techniques over all portions of the barrier layer 218, including those over the hardmask layer 210, and is not etched-back or planarized to the barrier layer 218. The result of the deposition without etching or planarization to the hardmask layer 210 is, as shown in FIG. 8, a barrier layer 218 that has a discontinuous upper surface. Namely, the barrier layer 218 has an upper surface that is provided at a first elevation over the hardmask layer 210 and at a second elevation over portion 217a of the fixed layer 217. The free layer 219, being blanked-deposited, fills the remaining portions of trench 211 as well as being provided over the portions of the barrier layer 218 that are over the hardmask layer 210. The free layer 219 may be planarized to achieve a substantially co-planar upper surface along its entire length, as shown in FIG. 8. The top electrode 221 is then formed over the free layer, substantially as described above in connection with FIG. 4.

In this embodiment, in order to protect the barrier layer from the formation of undesirable by-products thereon during subsequent processing steps, end portions 231, 232 of the top electrode 221, free layer 219, and barrier layer 218 may be removed, for example by etching, in preparation for the formation of protective sidewall spacer structures. As further shown in FIG. 8, a protective hardmask layer 222 is formed over the top electrode 221. With reference now to FIG. 9, for the removal of the end portions 231, 232, a suitable patterning and etching process, for example as described above with regard to the formation of trench 111, may be employed. This patterning/etching process results in the removal of the end portions 231, 232 of the top electrode 221, the free layer 219, and the barrier layer 218, as well as of the hardmask 222. This patterning/etching may be performed using one or a plurality of patterning and/or etching steps, as is known in the art. The etching process of the end portions employs hardmask layer 210 as an etch stop layer. Accordingly, as a resulting of this etching, an upper surface of hardmask layer 210 is re-exposed at the end portions 231, 232.

With attention now to FIG. 10, the protective sidewall spacer structures are then formed at the end portions 231, 232 using conventional spacer forming techniques, for example including the blanket deposition of a suitable spacer material such as oxides and/or nitrides of silicon, followed by the anisotropic etching of the spacer material to remove all of the spacer material over the hardmask layer 222, while leaving such material in place at the end portions 231, 232. The resulting sidewall spacer structures 223 are thus formed along sidewall portions of the top electrode 221, the free layer 219, and the fixed layer at the end portions 231, 232, as illustrated in FIG. 10. After the spacer formation, further etching could be carried out to remove the hardmask, oxide, fixed layer, and/or bottom electrode, if it is not defined initially.

Accordingly, the structure illustrated in FIG. 10 includes a bottom electrode 212, a fixed layer 217 formed over the bottom electrode, and a silicon oxide layer 213 and a hardmask layer 210 formed over the fixed layer 217. Formed within and over the silicon oxide layer 213 and the hardmask layer 210 is a barrier layer 218 that is formed conformally along sidewalls of the silicon oxide layer 213 and the hardmask layer 210, over a portion of the upper surface of the fixed layer 217, and over the hardmask layer 210. Formed over an entirety of the barrier layer 218 is a free layer 219. The free layer 219 has a substantially coplanar upper surface along an entire length thereof. Formed over the coplanar upper surface of the free layer 219 is a top electrode layer 221 and a further hardmask layer 222. Formed over end portions 231, 232 of the hardmask layer 210 are sidewall spacers 223, such that the sidewall spacers 223 are formed in the end portions 231, 232 adjacent to sidewalls of the barrier layer 218, the free layer 219, and the top electrode layer 221. In an alternative embodiment, spacer 223 is not used, rather in place thereof, a direct etch from the structure shown in FIG. 9 is employed to etch through the hardmask, oxide, fixed layer, and bottom electrode.

Similar to the above embodiment, the exemplary embodiment of FIGS. 6-10 does not require the use of the barrier layer 218 as an etch-stop layer while etching the free layer 219. Rather, the free layer 219 is formed over the barrier layer 218 without etching-back or planarizing to stop at or in the barrier layer. Further, with the sidewall spacer structures 223 being disposed along sidewalls of the barrier layer 218 and free layer 219 at the end portions 231, 232, there is no possibility for unwanted by-products to be formed thereon.

While at least one exemplary embodiment has been presented in the foregoing detailed description, it should be appreciated that a vast number of variations exist. It should also be appreciated that the exemplary embodiments are only examples, and are not intended to limit the scope, applicability, or configuration of the subject matter in any way. Rather, the foregoing detailed description will provide those skilled in the art with a convenient road map for implementing the exemplary embodiment or exemplary embodiments. It should be understood that various changes can be made in the function and arrangement of elements without departing from the scope as set forth in the appended claims and the legal equivalents thereof.

What is claimed is:
1. A method for fabricating a spin torque transfer magnetic random access memory integrated circuit comprising:
   forming a bottom electrode layer;
   forming a fixed layer over the bottom electrode layer;
   forming a silicon oxide layer over the fixed layer;
   forming a hardmask layer over the silicon oxide layer;
   forming a trench within the silicon oxide and hardmask layers, thereby exposing an upper surface of the fixed layer and sidewalls of the silicon oxide and hardmask layers;
   forming a conformal barrier layer along the sidewalls and over the upper surface of the fixed layer, such that the conformal barrier layer comprises sidewall portions adjacent the sidewalls and a central portion in between the sidewall portions and adjacent the upper surface of the fixed layer;

forming a free layer between the sidewall portions of the barrier layer and over the central portion of the barrier layer; and forming a top electrode layer over the free layer.

2. The method of claim 1, wherein forming the bottom electrode layer comprises forming a material layer comprising tantalum or titanium.

3. The method of claim 1, comprising forming the following layers: a TaN bottom electrode layer, a Ta seed layer overlying the TaN bottom electrode layer, a PtMn antiferromagnetic layer over the Ta seed layer, a CoFe pinned layer overlying the PtMn antiferromagnetic layer, an Ru coupling layer overlying the CoFe pinned layer, a CoFeB reference layer overlying the Ru coupling layer, a MgO barrier layer overlying the CoFeB reference layer, a CoFeB free layer overlying the MgO barrier layer, a Ta capping layer overlying the CoFeB free layer, and a TaN top electrode overlying the Ta capping layer.

4. The method of claim 1, wherein forming the hardmask layer comprises forming a material layer comprising silicon nitride, silicon oxide, or a combination thereof.

5. The method of claim 1, wherein forming the trench comprises forming a trench that is located centrally over the bottom electrode layer but having a width that is less than a width of the bottom electrode layer.

6. The method of claim 1, wherein forming the conformal barrier layer comprises forming a material layer comprising magnesium oxide.

7. The method of claim 1, wherein forming the free layer comprises forming a material layer comprising CoFeB.

8. The method of claim 1, wherein forming the top electrode layer comprises forming a material layer comprising tantalum or titanium.

9. The method of claim 1, wherein forming the free layer comprises conformally forming the free layer along the conformal barrier layer, wherein forming the free layer is performed so as to leave a portion of the trench unfilled.

10. The method of claim 1, wherein forming the free layer comprises performing a blanket deposition of the free layer over the conformal barrier layer, wherein forming the free layer is performed so as to fill an entirety of the trench.

11. The method of claim 1, wherein forming the free layer further comprises forming the free layer over the hardmask layer.

12. The method of claim 1, wherein forming the top electrode further comprises forming the top electrode over the hardmask layer and the barrier layer.

13. The method of claim 12, further comprising forming a further hardmask layer over the top electrode.

14. The method of claim 13, further comprising removing end portions of the further hardmask layer, the top electrode layer, the free layer, and the barrier layer, thereby exposing end portion upper surfaces of the hardmask layer and end portion sidewalls of the top electrode layer, the free layer, and the barrier layer.

15. The method of claim 14, further comprising forming sidewall spacers over the end portion upper surfaces of the hardmask layer and adjacent to the end portion sidewalls of the top electrode layer, the free layer and the barrier layer.

16. A spin torque transfer magnetic random access memory integrated circuit structure comprising:
a bottom electrode layer;
a fixed layer over the bottom electrode layer;
a silicon oxide layer over the fixed layer;
a hardmask layer over the silicon oxide layer;
a conformal barrier layer within the silicon oxide and hardmask layers, wherein the conformal barrier layer is disposed along sidewalls of the silicon oxide and hardmask layers and over an upper surface of the fixed layer such that the conformal barrier layer comprises sidewall portions adjacent the sidewalls of the silicon oxide and hardmask layers and a central portion in between the sidewall portions and adjacent the upper surface of the fixed layer;
a free layer between the sidewall portions of the barrier layer and over the central portion of the barrier layer; and
a top electrode layer over the free layer.

17. The integrated circuit structure of claim 16, further comprising a further hardmask layer over the top electrode layer.

18. The integrated circuit structure of claim 17, further comprising sidewall spacers adjacent end portion sidewalls of the top electrode layer, the free layer, and the barrier layer.

19. The integrated circuit structure of claim 18, wherein the conformal barrier layer and the free layer are further disposed over the hardmask layer.

20. The integrated circuit structure of claim 19, wherein the free layer comprises a substantially planar upper surface that extends over the hardmask layer.

* * * * *